(12) United States Patent
Rhodes

(10) Patent No.: US 7,355,228 B2
(45) Date of Patent: Apr. 8, 2008

(54) IMAGE SENSOR PIXEL HAVING PHOTODIODE WITH MULTI-DOPANT IMPLANTATION

(75) Inventor: Howard E. Rhodes, Boise, ID (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 402 days.

(21) Appl. No.: 10/966,263

(22) Filed: Oct. 15, 2004

(65) Prior Publication Data
US 2006/0103747 A1 May 18, 2006

(51) Int. Cl. H01L 31/062 (2006.01)
(52) U.S. Cl. .............. 257/292; 257/233; 257/E25.032; 257/E27.133; 438/48
(58) Field of Classification Search .............. None
See application file for complete search history.

(56) References Cited

U.S. PATENT DOCUMENTS 5,191,399 A * 3/1993 Maegawa et al. ........... 257/223
5,614,740 A * 3/1997 Gardner et al. ............. 257/222
6,271,553 B1 8/2001 Pan
6,645,799 B2 * 11/2003 Yamamoto .................. 438/199

FOREIGN PATENT DOCUMENTS

JP 2005072236 3/2005

OTHER PUBLICATIONS

European Search Report for European Application No. EP 05 25 6400, completed on Feb. 6, 2006, 2 pages.

* cited by examiner

Primary Examiner—Sue A. Purvis
Assistant Examiner—Scott R Wilson
(74) Attorney, Agent, or Firm—Blakely Sokoloff Taylor & Zafman LLP

(57) ABSTRACT

An active pixel using a photodiode with multiple species of N type dopants is disclosed. The pixel comprises a photodiode formed in a semiconductor substrate. The photodiode is an $N^-$ region formed within a P-type region. The $N^-$ region is formed from an implant of arsenic and an implant of phosphorus. Further, the pixel includes a transfer transistor formed between the photodiode and a floating node and selectively operative to transfer a signal from the photodiode to the floating node. Finally, the pixel includes an amplification transistor controlled by the floating node.

31 Claims, 2 Drawing Sheets

IMAGE SENSOR PIXEL HAVING PHOTODIODE WITH MULTI-DOPANT IMPLANTATION

TECHNICAL FIELD

The present invention relates to image sensors, and more particularly, to an image sensor that uses pixels having a photodiode formed from multiple dopants to form either the N type region (for a pnp photodiode) or the P type region (for an npn photodiode).

BACKGROUND

Image sensors have become ubiquitous. They are widely used in digital still cameras, cellular phones, security cameras, medical, automobile, and other applications. The technology used to manufacture image sensors, and in particular CMOS image sensors, has continued to advance at great pace. For example, the demands of higher resolution and lower power consumption have encouraged the further miniaturization and integration of the image sensor.

As the pixels become smaller, the surface area that can receive incident light is also reduced. The pixel typically has a light-sensing element, such as a photodiode, which receives incident light and produces a signal in relation to the amount of incident light. Thus, as the pixel area (and thus the photodiode area) decreases, the well capacity of the photodiode also becomes smaller.

One prior art structure of a photodiode that has enhanced well capacity comprises a shallow $N^-$ layer in a P-type region or substrate. A $P^+$ pinning layer is then formed over the shallow $N^-$ layer. This structure is known as a pinned photodiode and has relatively high well capacity, but sometimes at the expense of "dark current" performance and excess "hot pixel" defects. Moreover, by substituting a deeper $N^-$ layer for the shallow $N^-$ layer, a lower hot pixel defect density can be achieved, but this will also result in a lower well capacity that in turn limits signal to noise ratio performance.

The present invention is directed towards a photodiode and pixel design that has high well capacity and with limited dark noise and hot pixel defect density.

DETAILED DESCRIPTION

In the following description, numerous specific details are provided in order to give a thorough understanding of embodiments of the invention. One skilled in the relevant art will recognize, however, that the invention may be practiced without one or more of the specific details, or with other methods, components, materials, etc. In other instances, well known structures, materials, or operations are not shown or described in order to avoid obscuring aspects of the invention.

Referenced throughout the specification to "one embodiment" or "an embodiment" means that a particular feature, structure, or characteristic described in connection with the embodiment and included in at least one embodiment of the present invention. Thus, the appearances of the phrase "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
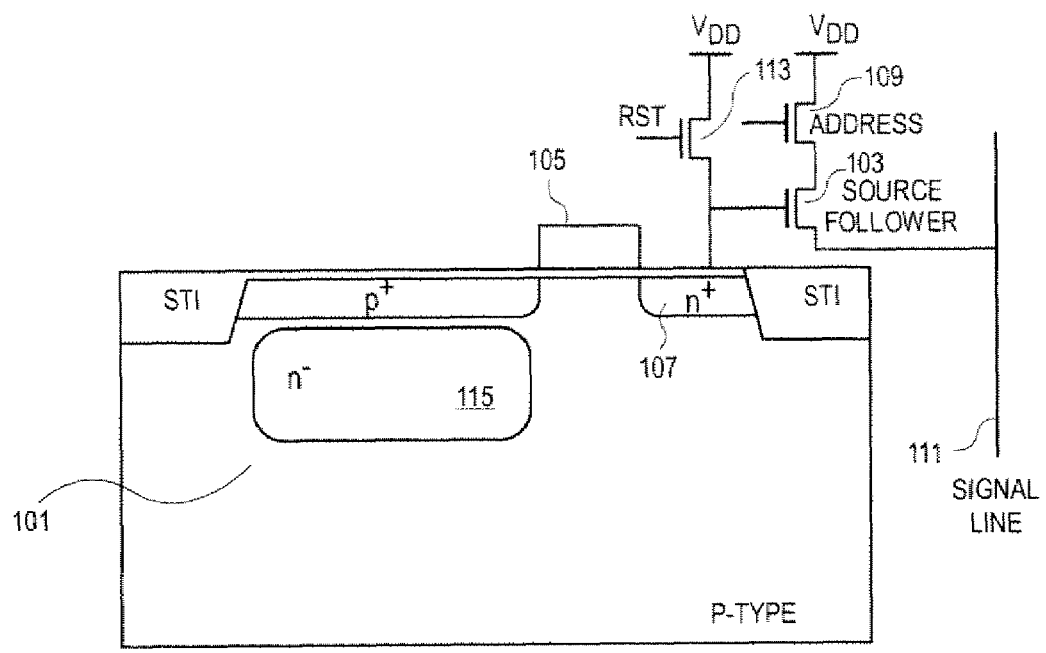
FIG. 1 is a combination cross-sectional and schematic diagram of a prior art four transistor (4T) pixel which shows in detail a photodiode formed in a substrate.

FIG. 1 shows a combination cross-sectional and schematic view of a prior art active pixel that uses four transistors. This is known in the art as a 4T active pixel. However, it can be appreciated that the photodiode design of the present invention can be used with any type of pixel design, including but not limited to 3T, 4T, 5T, 6T, and other designs. Further, the photodiode design of the present invention may also be used in connection with charge coupled device (CCD) imagers.

A photodiode 101, outputs a signal that is used to modulate an amplification transistor 103. The amplification transistor 103 is also referred to as a source follower transistor. In this embodiment, the photodiode 101 can be either a pinned photodiode or a partially pinned photodiode. A transfer transistor 105 is used to transfer the signal output by the photodiode 101 to a floating node 107 (N+ doped), which is adjacent to the gate of the amplification transistor 105. The transfer transistor 105 is controlled by a transfer gate.

In operation, during an integration period (also referred to as an exposure or accumulation period), the photodiode 101 generates charge (in response to incident light) that is held in the $N^-$ layer 115. After the integration period, the transfer transistor 105 is turned on to transfer the charge held in the $N^-$ layer 115 of the photodiode 101 to the floating node 107. After the signal has been transferred to the floating node 107, the transfer transistor 105 is turned off again for the start of a subsequent integration period.

The signal on the floating node 107 is then used to modulate the amplification transistor 103. Finally, an address transistor 109 is used as a means to address the pixel and to selectively read out the signal onto a column bitline 111. After readout through the column bitline 111, a reset transistor 113 resets the floating node 107 to a reference voltage. In one embodiment, the reference voltage is $V_{dd}$.

As noted above, electrons are accumulated in the $N^-$ layer 115 during the integration period. After the integration period, the electrons (signal) are transferred from the $N^-$ layer 115 into the floating node 107 by applying a high voltage pulse to the transfer gate of the transfer transistor 105.

In the prior art, the $N^-$ layer 115 is typically formed from a single species of "N type dopant", such as arsenic or phosphorus. Arsenic, because of its lower diffusivity during ion implantation, tends to form a shallower, yet higher concentration doping profile. In contrast, phosphorus, because of its relatively higher diffusivity during ion implantation, tends to form a deeper, yet lower concentration doping profile.

Figure 2:
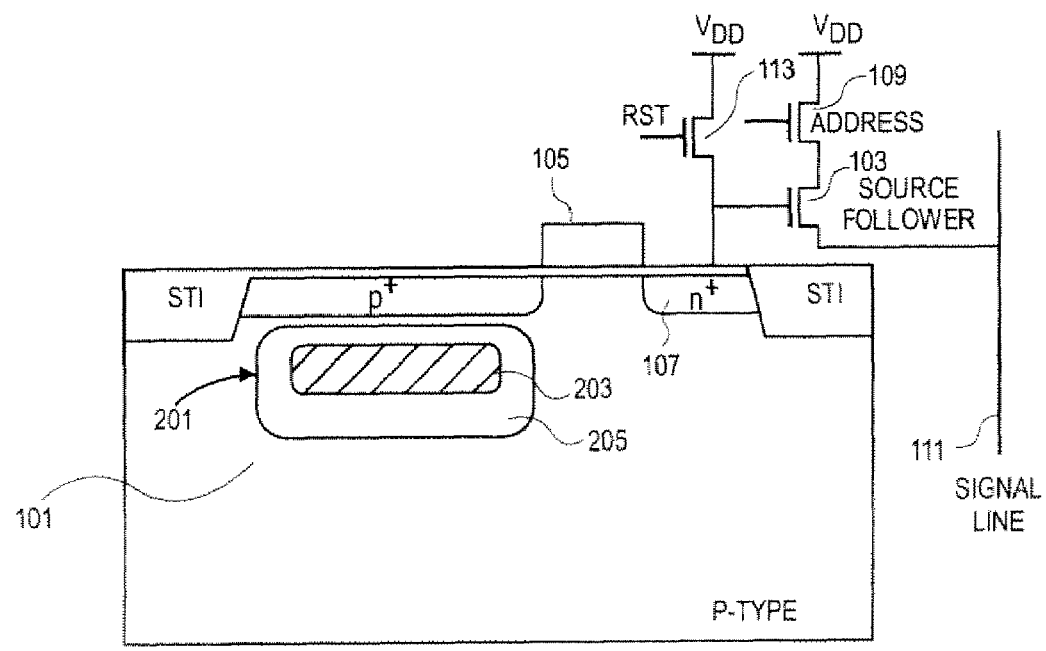
FIG. 2 is a combination cross-sectional and schematic diagram of a photodiode and pixel formed in accordance with the present invention.

In accordance with the present invention, at least two (or more) types of dopants, such as arsenic and phosphorus, are used as dopants to form the $N^-$ layer 115. Thus, turning to FIG. 2, a first implantation of arsenic is performed to form arsenic implant region 203. Then, a second implantation of phosphorus is performed to from phosphorus implant region 205. Note that in this embodiment, the phosphorus implant region 205 substantially surrounds the arsenic implant region 203.

The embodiment described herein uses arsenic and phosphorus as one example of a pair of dopants because they are so commonly used in the current semiconductor manufacturing processes. However, it can be appreciated that different combinations of N type dopants may be used. The combination of dopants should have different relative diffusivities. For example, the combination of antimony (Sb) and phosphorus would be suitable. Still, nearly any combination of N type dopants (nitrogen, phosphorus, arsenic, antimony, or bismuth) would provide a benefit.

Figure 3:
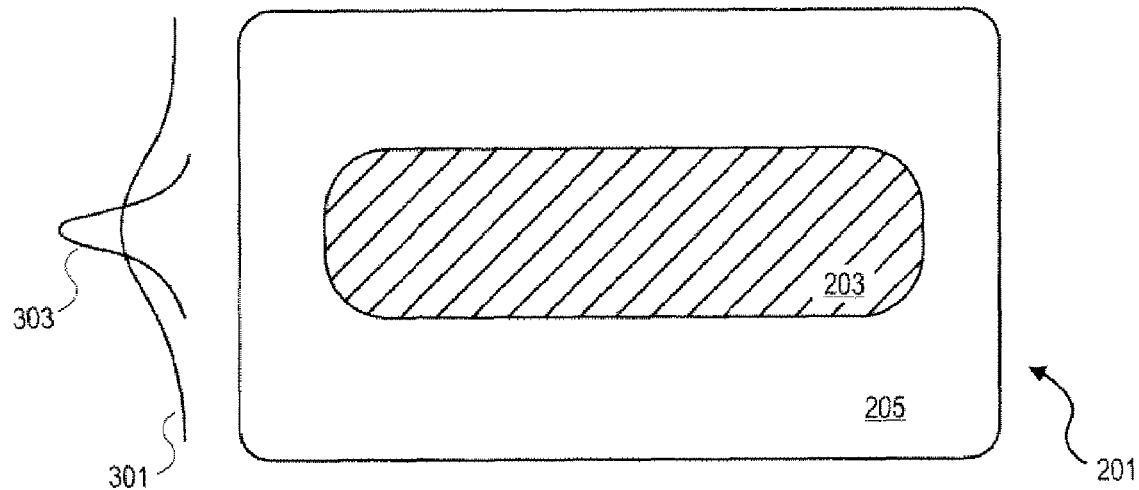
FIG. 3 is a combination cross-sectional and schematic diagram of the photodiode of FIG. 2 showing the impurity profile of the $N^-$ layer.

Turning to FIG. 3, the arsenic implant region 203 is relatively shallow and has relatively low diffusivity. Thus, the dopant profile 303 of the arsenic implant region 203 is "high and narrow". In contrast, the phosphorus implant region 205 is relatively deep and has relatively high diffusivity. Thus, the dopant profile 301 of the phosphorus implant region 205 is "low and wide". In one embodiment, the arsenic implant is in the range 50 keV-250 keV, and more preferably 100 keV-180 keV. The corresponding phosphorus implant is 25 keV-125 keV, and more preferably 50 keV-90 keV. However, other implantation energies may be equally suitable.

In this embodiment, the peaks of the dopant profiles 301 and 303 coincide, but it can be appreciated that the peaks need not be aligned. The arsenic implant region 203 tends to supply a high well capacity, while the phosphorus implant region 205 tends to grade to junction to provide low dark current and low hot pixel defect density.

Figure 4:
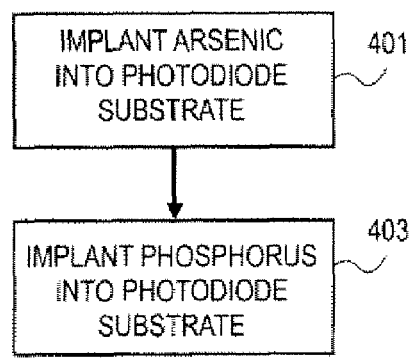
FIG. 4 is a flow diagram showing a method of making a photodiode in accordance with the present invention.

Turning to FIG. 4, a flow diagram illustrating a method of forming a photodiode in accordance with the present invention is shown. First, at box 401, the arsenic is implanted into the P type substrate where the photodiode is to be formed. Then, at box 403, phosphorus is implanted into the same region of the P type substrate.

It should be noted that the above description and Figures illustrate the present invention as applied to a pinned photodiode. However, the advantages of the present invention may also be applied to non-pinned photodiodes.

Furthermore, the above description and Figures illustrate the present invention as applied to a pnp pinned photodiode or simply a photodiode formed from an N type implant in a P type substrate. The advantages of the present invention may also be applied to an npn pinned photodiode or simply a photodiode formed from a P type implant in an N type substrate. In such an embodiment, the P type dopants is a combination of a dopant with a relatively high diffusivity, such as boron (B), and a dopant with a relatively low diffusivity, such as indium (In).

It can be appreciated that different combinations of P type dopants may be used. It is important to choose the combinations of dopants such that they have different relative diffusivities. Nearly any combination of P type dopants (boron, aluminum, gallium, indium, and thallium) would provide a benefit.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:
1. A pixel comprising:
a photodiode formed in a semiconductor substrate, said photodiode being an N$^-$ region formed within a P-type region, said N$^-$ region being formed from an implant of a first type of N type dopant and an implant of a second type of N type dopant, wherein said first type of N type dopant has a different diffusivity than said second type of N type dopant, wherein said first N type dopant is completely surrounded by said second N type dopant.
2. The pixel of claim 1 wherein said photodiode has a P+ pinning layer on the surface of said semiconductor substrate and above said N$^-$ region.
3. The pixel of claim 1 wherein said first N type dopant is arsenic and said second N type dopant is phosphorus.
4. The pixel of claim 1 wherein said first N type dopant is antimony and said second N type dopant is phosphorus.
5. The pixel of claim 1 wherein the peak concentration of said first N type dopant is substantially co-located with the peak concentration of said second N type dopant.
6. The pixel of claim 1 further including: (1) a transfer transistor formed between said photodiode and a floating node and selectively operative to transfer a signal from said photodiode to said floating node, and (2) an amplification transistor controlled by said floating node.
7. The pixel of claim 6 wherein said pixel is a part of a 3T, 4T, 5T, 6T, or 7T architecture.
8. The pixel of claim 1 further including a reset transistor operative to reset said floating node to a reference voltage.
9. The pixel of claim 1 wherein it is incorporated into a CCD image sensor.
10. The pixel of claim 1 wherein it is incorporated into a CMOS image sensor.
11. A pixel comprising:
a photodiode formed in a semiconductor substrate, said photodiode being an N$^-$ region formed within a P-type region, said N$^-$ region being formed from an implant of a first type of N type dopant and an implant of a second type of N type dopant, wherein said first type of N type dopant has a different diffusivity than said second type of N type dopant, wherein said first N type dopant is completely surrounded by said second N type dopant; and
a P+ pinning layer formed on the surface of said semiconductor substrate and over said N$^-$ region.
12. The pixel of claim 11 wherein said first N type dopant is arsenic and said second N type dopant is phosphorus.
13. The pixel of claim 11 wherein said first N type dopant is antimony and said second N type dopant is phosphorus.
14. The pixel of claim 11 wherein it is incorporated into a CCD image sensor.
15. The pixel of claim 11 wherein it is incorporated into a CMOS image sensor.
16. A pixel comprising:
a photodiode formed in a semiconductor substrate, said photodiode being an P$^+$ region formed within a N-type region, said P$^+$ region being formed from an implant of a first type of P type dopant and an implant of a second type of P type dopant, wherein said first type of P type dopant has a different diffusivity than said second type of P type dopant, wherein said first P type dopant is boron and said second P type dopant is indium.
17. The pixel of claim 16 wherein said photodiode has a N+ pinning layer on the surface of said semiconductor substrate and above said P$^-$ region.
18. The pixel of claim 16 wherein said first P type dopant is substantially surrounded by said second P type dopant.

19. The pixel of claim 16 further including: (1) a transfer transistor formed between said photodiode and a floating node and selectively operative to transfer a signal from said photodiode to said floating node, and (2) an amplification transistor controlled by said floating node.

20. The pixel of claim 16 wherein it is incorporated into a CCD image sensor.

21. The pixel of claim 16 wherein it is incorporated into a CMOS image sensor.

22. The pixel of claim 16 wherein said pixel is a part of a 3T, 4T, 5T, 6T, or 7T architecture.

23. A pixel comprising:
a photodiode formed in a semiconductor substrate, said photodiode being an P⁻ region formed within a N-type region, said P⁻ region being formed from an implant of a first type of P type dopant and an implant of a second type of P type dopant, wherein said first type of P type dopant has a different diffusivity than said second type of P type dopant, wherein said first P type dopant is boron and said second P type dopant is indium; and
a N+ pinning layer formed on the surface of said semiconductor substrate and over said P⁻ region.

24. The pixel of claim 23 wherein said first P type dopant is substantially surrounded by said second P type dopant.

25. A photodiode formed in a semiconductor substrate, said photodiode being an N⁻ region formed within a P-type region, said N⁻ region being formed from an implant of a first N type dopant and a second N type dopant, said first and second N type dopants having different diffusivities, wherein said first N type dopant is completely surrounded by said second N type dopant.

26. The photodiode of claim 25 wherein said first N type dopant is arsenic and said second N type dopant is phosphorus.

27. The photodiode of claim 25 wherein said photodiode has a P+ pinning layer on the surface of said semiconductor substrate and above said N⁻ region.

28. The photodiode of claim 25 wherein said first N type dopant is antimony and said second N type dopant is phosphorus.

29. A photodiode formed in a semiconductor substrate, said photodiode being an P⁻ region formed within a N-type region, said P⁻ region being formed from an implant of a first P type dopant and a second P type dopant, said first and second P type dopants having different diffusivities, wherein said first P type dopant is boron and said second P type dopant is indium.

30. The photodiode of claim 29 wherein said photodiode has a N+ pinning layer on the surface of said semiconductor substrate and above said P⁻ region.

31. The photodiode of claim 29 wherein said first P type dopant is substantially surrounded by said second P type dopant.

* * * * *